(12) United States Patent
Murase et al.

(10) Patent No.: US 8,952,350 B2
(45) Date of Patent: Feb. 10, 2015

(54) NON-VOLATILE MEMORY DEVICE AND MANUFACTURING METHOD THEREOF (71) Applicant: Panasonic Corporation, Osaka (JP)

(72) Inventors: Hideaki Murase, Osaka (JP); Yoshio Kawashima, Osaka (JP); Atsushi Himeno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/038,667

(22) Filed: Sep. 26, 2013

(65) Prior Publication Data

US 2014/0097396 A1    Apr. 10, 2014

(30) Foreign Application Priority Data

Sep. 26, 2012  (JP) ................................. 2012-211750

(51) Int. Cl.
*H01L 47/00* (2006.01)
*G11C 11/00* (2006.01)
(Continued)

(52) U.S. Cl.
CPC .......... *H01L 45/146* (2013.01); *H01L 45/1286* (2013.01); *H01L 45/124* (2013.01); *H01L 45/1675* (2013.01); *H01L 45/1666* (2013.01); *H01L 45/08* (2013.01); *H01L 45/1233* (2013.01); *H01L 27/2409* (2013.01)
USPC ................ 257/4; 257/536; 438/382; 365/148

(58) Field of Classification Search
None
See application file for complete search history.

(56) References Cited

U.S. PATENT DOCUMENTS

| | | | |
|---|---|---|---|
| 7,400,006 | B1 | 7/2008 | Rinerson et al. |
| 7,439,082 | B2 | 10/2008 | Rinerson et al. |

(Continued)

FOREIGN PATENT DOCUMENTS

| | | |
|---|---|---|
| JP | 62-262890 A | 11/1987 |
| JP | 01-177515 A | 7/1989 |

(Continued)

OTHER PUBLICATIONS

Japanese Office Action issued in Japanese Application No. 2013-198008 dated May 7, 2014.

*Primary Examiner* — Andres Munoz
(74) *Attorney, Agent, or Firm* — McDermott Will & Emery LLP (57) ABSTRACT

A non-volatile memory device of the present invention comprises a first electrode; a variable resistance layer formed on and above the first electrode; a second electrode formed on and above the variable resistance layer; a side wall protective layer having an insulativity and covering a side wall of the first electrode, a side wall of the variable resistance layer and a side wall of the second electrode; and an electrically-conductive layer connected to the second electrode; the non-volatile memory device including a connection layer which is provided between the second electrode and the electrically-conductive layer to connect the second electrode and the electrically-conductive layer to each other, and comprises an electrically-conductive material different from a material constituting the electrically-conductive layer;
wherein the side wall protective layer extends across the second electrode to a position which is above an upper end of the second electrode and below an upper end of the connection layer such that an upper end of the side wall protective layer is located above the upper end of the second electrode and below the upper end of the connection layer, when viewed from a side.

14 Claims, 5 Drawing Sheets

(51) Int. Cl.
*H01L 45/00* (2006.01)
*H01L 27/24* (2006.01)

(56) References Cited

U.S. PATENT DOCUMENTS

| | | |
|---|---|---|
| 2009/0283736 A1 | 11/2009 | Kanzawa et al. |
| 2010/0059730 A1 | 3/2010 | Ito et al. |
| 2011/0001110 A1* | 1/2011 | Takahashi ................ 257/2 |
| 2011/0147691 A1 | 6/2011 | Yasutake |
| 2011/0233500 A1 | 9/2011 | Nishimura et al. |
| 2011/0294259 A1 | 12/2011 | Kanzawa et al. |
| 2012/0199805 A1* | 8/2012 | Sorada et al. ................ 257/2 |
| 2013/0112935 A1 | 5/2013 | Himeno et al. |
| 2013/0140515 A1 | 6/2013 | Kawashima et al. |
| 2013/0163323 A1 | 6/2013 | Yasutake |

FOREIGN PATENT DOCUMENTS

| | | |
|---|---|---|
| JP | 2008-218855 A | 9/2008 |
| JP | 2011-009485 A | 1/2011 |
| JP | 2011-199197 A | 10/2011 |
| WO | 2008/149484 A1 | 12/2008 |
| WO | 2012/073503 A1 | 6/2012 |

* cited by examiner

NON-VOLATILE MEMORY DEVICE AND MANUFACTURING METHOD THEREOF

CROSS-REFERENCE TO RELATED PATENT APPLICATION

The application claims priority to Japanese Patent Application No. 2012-211750, filed on Sep. 26, 2012, the entire disclosure of which is incorporated herein by reference.

BACKGROUND OF THE INVENTION

1. Field of the Invention

The present invention relates to a non-volatile memory device and a manufacturing method thereof. More particularly, the present invention relates to a variable resistance non-volatile memory device including a variable resistance element which reversibly changes its resistance value in response to an electric pulse applied thereto, and a manufacturing method thereof.

2. Description of the Related Art

In recent years, with progresses of digital technologies, electronic devices such as portable information devices and information home electric appliances have been developed to provide higher functionalities. With achievement of the higher functionalities of these electronic devices, further miniaturization and higher-speeds of semiconductor elements incorporated into these electronic devices have been progressing at a high pace. Among them, use of a high-capacity non-volatile memory, which is represented by a flash memory, has been expanding at a high pace. Furthermore, as a novel non-volatile memory in a next generation which has a potential of replacing this flash memory, a resistive random access memory (ReRAM) incorporating a variable resistance element has been studied and developed.

The variable resistance element refers to an element having a characteristic in which it reversibly changes its resistance state (resistance value) in response to an electric signal and is able to preserve the changed state. By allocating information to respective resistance states of the variable resistance element, the information can be stored in a non-volatile manner. Specifically, for example, "0" is allocated to one of a low-resistance state in which a resistance value is relatively small and a high-resistance state in which its resistance value is greater than the resistance value corresponding to the low-resistance state, and "1" is allocated to the other of these resistance states, binary information can be stored.

The conventional variable resistance element is configured to include, for example, a variable resistance layer disposed between a first electrode and a second electrode, the variable resistance layer comprising two variable resistance materials which are different in degree of oxygen deficiency from each other and stacked together. By applying an electric pulse (e.g., voltage pulse) between the first electrode and the second electrode of the variable resistance element, the resistance state is changed from the high-resistance state to the low-resistance state or from the low-resistance state to the high-resistance state.

In the variable resistance memory, it is desired that the low-resistance state and the high-resistance state corresponding to the binary information be clearly distinguished from each other, and switching between the low-resistance state and the high-resistance state take place stably and at a high speed.

International Publication No. 2008/149484 discloses a non-volatile memory element which includes a first electrode, a second electrode and a variable resistance layer which is interposed between the first electrode and the second electrode and reversibly changes its resistance value in response to electric signals which are applied between these electrodes and are different in polarity from each other, the variable resistance layer including in a thickness direction thereof a first region comprising a first oxygen-deficient tantalum oxide having a composition expressed as $TaO_x$ ($0<x<2.5$) and a second region comprising a second oxygen-deficient tantalum oxide having a composition expressed as $TaO_y$ ($x<y<2.5$).

International Publication No. 2012/073503 discloses a non-volatile memory element which includes a first metal wire, a plug formed on and above the first metal wire and connected to the first metal wire, a stacked-layer structure which includes a first electrode, a second electrode and a variable resistance layer and is formed on and above the plug such that the first electrode is connected to the plug, a second metal wire formed on and above the stacked-layer structure such that the second metal wire is directly connected to the second electrode, and a side wall protective layer which covers a side wall of the stacked-layer structure and has an insulativity and an oxygen barrier capability, a portion of a lower surface of the second metal wire being located below an upper surface of the stacked-layer structure.

SUMMARY OF THE INVENTION

The conventional non-volatile memory device has a problem that there is a possibility of thermal degradation in manufacturing process steps.

The present invention addresses the above mentioned problem associated with the prior art, and an object is to reduce a possibility that thermal degradation in manufacturing process steps occurs, in a non-volatile memory device.

According to an aspect of the present invention, a non-volatile memory device comprises: a first electrode; a variable resistance layer formed on and above the first electrode; a second electrode formed on and above the variable resistance layer; a side wall protective layer having an insulativity and covering a side wall of the first electrode, a side wall of the variable resistance layer and a side wall of the second electrode; and an electrically-conductive layer connected to the second electrode; the non-volatile memory device including a connection layer which is provided between the second electrode and the electrically-conductive layer to connect the second electrode and the electrically-conductive layer to each other and comprises an electrically-conductive material different from a material constituting the electrically-conductive layer; wherein the side wall protective layer extends across the second electrode to a position which is above an upper end of the second electrode and below an upper end of the connection layer such that an upper end of the side wall protective layer is located above the upper end of the second electrode and below the upper end of the connection layer, when viewed from a side.

According to an aspect of the present invention, a method of manufacturing a non-volatile memory device comprises the steps of: forming a hard mask comprising an electrically-conductive material, on and above a stacked-layer structure including a first electrode material layer, a variable resistance material layer and a second electrode material layer such that the first electrode material layer, the variable resistance material layer and the second electrode material layer are stacked in this order; etching the stacked-layer structure using the hard mask, to form a first electrode, a variable resistance layer and a second electrode while leaving the hard mask; and forming a side wall protective layer such that the side wall protective layer covers a side wall of the first electrode, a side wall of the variable resistance layer, a side wall of the second electrode, and a side wall of the hard mask, in a state in which the hard mask is left on and above the second electrode, and the side wall protective layer extends across the second electrode to a position above an upper end of the second electrode and below an upper end of the connection layer, when viewed from a side.

In accordance with one aspect of the present invention, it becomes possible to achieve advantages that a possibility of thermal degradation in manufacturing process steps can be reduced in the non-volatile memory device.

DETAILED DESCRIPTION OF THE PREFERRED EMBODIMENTS

[Terms]

In the embodiments of the present invention, the term "oxygen content atomic percentage" refers to a ratio of the number of oxygen atoms contained in a metal oxide to the total number of atoms constituting the metal oxide.

The term "degree of oxygen deficiency" refers to a ratio of oxygen deficiency with respect to an amount of oxygen constituting an oxide having a stoichiometric composition (stoichiometric composition corresponding to a greatest resistance value in a case where there exist plural stoichiometric compositions) of each metal oxide. For example, in a case where metal is tantalum (Ta), a stoichiometric composition of an oxide of tantalum is $Ta_2O_5$, and therefore is expressed as $TaO_{2.5}$. The degree of oxygen deficiency of $TaO_{2.5}$ is 0%. For example, the degree of oxygen deficiency of an oxygen-deficient tantalum oxide having a composition of $TaO_{1.5}$, is $(2.5-1.5)/2.5=40\%$. An oxygen excess metal oxide has a negative value in degree of oxygen deficiency. In the present specification, the degree of oxygen deficiency is meant to include a positive value, 0 and a negative value unless otherwise explicitly noted.

The term "oxygen-deficient metal oxide" means a metal oxide which is less in oxygen content (atom ratio: ratio of the number of oxygen atoms to the total number of atoms) than a metal oxide having a stoichiometric composition.

The term "metal oxide having a stoichiometric composition" refers to a metal oxide which is 0% in degree of oxygen deficiency. For example, in the case of the tantalum oxide, the metal oxide having a stoichiometric composition refers to $Ta_2O_5$ which is an insulator. The oxygen-deficient metal oxide is allowed to have an electric conductivity, because of its oxygen deficiency. An oxide which is lower in degree of oxygen deficiency is closer to the oxide having a stoichiometric composition and therefore has a greater resistance value, while an oxide which is higher in degree of oxygen deficiency is closer to a metal constituting the oxide and therefore has a smaller resistance value.

The term "oxygen content atomic percentage" refers to a ratio of the number of oxygen atoms contained in the metal oxide to the total number of atoms constituting the metal oxide. The oxygen content atomic percentage of $Ta_2O_5$ is the ratio of the number of oxygen atoms to the total number of atoms (O/(Ta+O)) and is 71.4%. Therefore, the oxygen content atomic percentage of the oxygen-deficient tantalum oxide is higher than 0 and lower than 71.4%. In a case where the metal constituting the first metal oxide and the metal constituting the second metal oxide are of the same kind, a magnitude relationship of the degree of oxygen deficiency can be expressed as the oxygen content atomic percentage. For example, when the degree of oxygen deficiency of the first metal oxide is higher than the degree of oxygen deficiency of the second metal oxide, the oxygen content atomic percentage of the first metal oxide is lower than the oxygen content atomic percentage of the second metal oxide.

The term "insulator" may be defined as a general one. That is, the insulator is meant to comprise a material having a resistivity of $10^8$ Ωcm or greater (Non-patent literature: presented "Semiconductor engineering for integrated circuit" industry search committee (1992), Akira Usami, Shinji Kanefusa, Takao Maekawa, Hajime Tomokage, Morio Inoue). By comparison, the term "electric conductor" refers to an element comprising a material having a resistivity which is less than $10^8$ Ωcm. It should be noted that before execution of an initial breakdown operation occurs, there is a difference of 4-digit to 6-digit numeric value or more between the resistivity of the first metal oxide and the resistivity of the third metal oxide. The resistivity of the variable resistance element after execution of the initial breakdown operation is, for example, about $10^4$ Ωcm.

The term "standard electrode potential" typically refers to a degree to which a material is easily oxidized. As a value of the standard electrode potential is greater, the corresponding material is less easily oxidized, while as a value of the standard electrode potential is smaller, the corresponding material is more easily oxidized. As a difference in standard electrode potential between the electrode and a low-degree-oxygen-deficiency layer (second variable resistance layer) which is low in degree of oxygen deficiency, is greater, a redox reaction more easily occurs, and resistance change more easily occurs. Also, as the difference in standard electrode potential is smaller, the redox reaction less easily occurs, and resistance change less easily occurs. Therefore, it is estimated that the degree to which the material is easily oxidized has an important role in a mechanism of a resistance changing phenomenon.

The non-volatile memory element disclosed in Patent Literature 2 includes the side wall protective layer covering the side wall of the stacked-layer structure and having an insulativity and an oxygen barrier capability. However, according to the present inventors' study, it was revealed that there may exist a case where in actual manufacturing process steps, heat release does not appropriately proceed after a heating process step (e.g., including a process before the electrically-conductive layer is filled into the opening, a process after the electrically-conductive layer is filled into the opening, etc.), because of the presence of the side wall insulating layer which does not have a high heat conductivity. This insufficient heat release may cause a possibility of thermal degradation (e.g., degradation of variable resistance layer, etc.) in the manufacturing process steps.

Based on the new findings, the present inventors conceived that there is provided a connection layer located between a second electrode and an electrically-conductive layer to connect the second electrode and the electrically-conductive layer to each other, and comprising an electrically-conductive material different from a material constituting the electrically-conductive layer, and the side wall protective layer is configured to extend across the second electrode to a position which is above an upper end of an upper electrode and below an upper end of the connection layer such that an upper end of the side wall protective layer is located above the upper end of the upper electrode and below the upper end of the connection layer when viewed from a side. In this structure, in the non-volatile memory device, an area (area of a heat release surface) of an exposed portion of the connection layer is greater than that in a structure in which the side wall protective layer extends to the upper end of the connection layer. Since the connection layer comprises the electrically-conductive material having a high heat conductivity, a heat release capability of the element can be enhanced. This can reduce a possibility of thermal degradation in manufacturing process steps.

(Embodiments)

Hereinafter, embodiments of the present invention will be described with reference to the accompanying drawings.

In description of the embodiments of the present invention, a vertical direction is defined such that a direction from the first electrode toward the second electrode is "upper" and a direction from the second electrode toward the first electrode is "lower". In a case where the non-volatile memory device includes a substrate, typically, "upper" indicates a direction which is more distant from the substrate, and "lower" indicates a direction which is closer to the substrate. However, for example, in a case where the electrode which is closer to the substrate is the second electrode and the electrode which is more distant from the substrate is the first electrode, a direction which is more distant from the substrate is "lower" and a direction which is closer to the substrate is "upper". "Upper surface" of each of layers between the first electrode and the second electrode is a surface of the layer which faces the second electrode. Conversely, "bottom surface" of each of layers between the first electrode and the second electrode is a surface of the layer which faces the first electrode. Note that these surfaces are not limited to flat surfaces and may include curved surfaces.

The embodiments described hereinafter are specific examples of the present invention. Numeric values, shapes, materials, constituents (elements), layout positions of the constituents, connection form of the constituents, steps, the order of the steps, etc., which are illustrated in the embodiments described below, are merely exemplary, and are not intended to limit the present invention. Also, among the constituents in the embodiments described below, the constituents which are not recited in independent claims defining a broadest concept of the present invention will be described as arbitrary constituents. Description of the constituents designated by the same reference numerals in the drawings will be sometimes omitted. For easier illustration, in the drawings, the constituents are schematically shown, and their shapes, dimension ratio, etc., are not sometimes accurate. Moreover, in a manufacturing method, the order of the steps, etc., can be changed and other known steps may be added.

(Embodiment 1)

According to Embodiment 1 of the present invention, a non-volatile memory device comprises: a first electrode; a variable resistance layer formed on and above the first electrode; a second electrode formed on and above the variable resistance layer; a side wall protective layer having an insulativity and covering a side wall of the first electrode, a side wall of the variable resistance layer and a side wall of the second electrode; and an electrically-conductive layer connected to the second electrode; the non-volatile memory device including a connection layer which is provided between the second electrode and the electrically-conductive layer to connect the second electrode and the electrically-conductive layer to each other and comprises an electrically-conductive material different from a material constituting the electrically-conductive layer; wherein the side wall protective layer extends across the second electrode to a position which is above an upper end of the second electrode and below an upper end of the connection layer such that an upper end of the side wall protective layer is located above the upper end of the second electrode and below the upper end of the connection layer, when viewed from a side.

Figure 1:
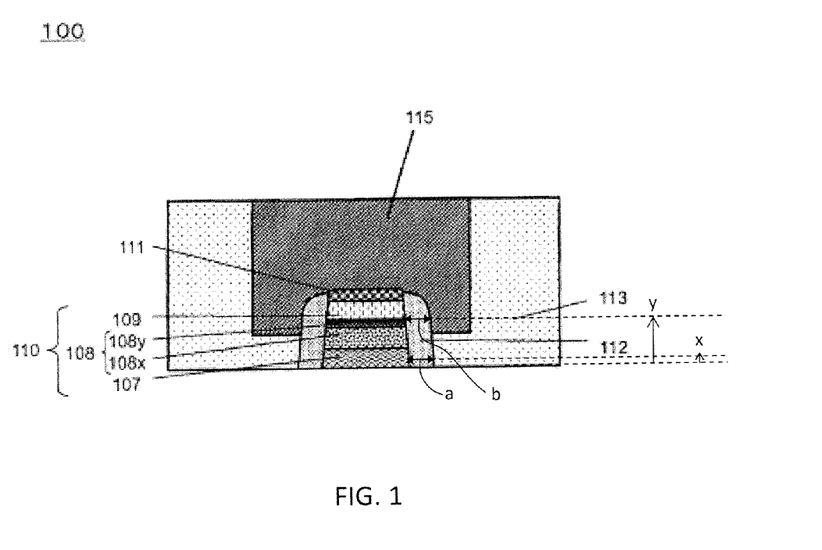
FIG. 1 is a cross-sectional view showing an exemplary schematic configuration of a non-volatile memory device according to Embodiment 1.

As shown in FIG. 1, with the connection layer provided between the second electrode and the electrically-conductive layer, the second electrode and the electrically-conductive later are not physically in contact with each other. The term "electrically-conductive layer connected to the second electrode" means that the second electrode and the electrically-conductive later are electrically connected to each other via the connection layer.

In this structure, in the non-volatile memory device, an area (area of heat release surface) of an exposed portion of the connection layer is greater than that in a structure in which the side wall protective layer extends to the upper end of the connection layer. Since the connection layer comprises the electrically-conductive material having a high heat conductivity, a heat release capability of the element can be enhanced. This can reduce a possibility of thermal degradation in the manufacturing process steps.

In the above non-volatile memory device, the side wall protective layer may comprise at least one material selected from a group consisting of an oxide, a nitride, and an oxynitride.

In the above non-volatile memory device, the side wall protective layer may comprise at least one material selected from a group consisting of a silicon nitride, an aluminum oxide, and a titanium oxide.

In this configuration, it becomes possible to suppress proceeding of oxidation in a side surface of the variable resistance layer by the step of depositing the interlayer insulating layer and the step of heating in the manufacturing process steps after forming the variable resistance element. This makes it possible to lessen non-uniformity of effective cross-sectional areas of variable resistance layers. As a result, non-uniformity of densities of currents flowing through variable resistance layers is lessened, an electric failure is reduced, a reduction of a yield is prevented, and reliability can be improved.

In the above non-volatile memory device, the side wall protective layer may be configured such that a thickness a in a position of a height x from a horizontal plane passing through a lower end of the first electrode and a thickness b in a position of a height y from the lower end of the first electrode satisfy a>b when x<y.

In this configuration, the side wall protective layer covering the side wall of the variable resistance element is thinner in an upward direction from a base portion thereof. Since the side wall protective layer is thinner in a position above an uppermost surface of the second electrode, a good coverage of the barrier metal layer can be attained, and it becomes possible to reduce a possibility that the barrier metal layer is discontinuous in a level difference portion during formation of the electrically-conductive layer.

In the above non-volatile memory device, the variable resistance layer may include at least two layers including: a first variable resistance layer comprising a first metal oxide; and a second variable resistance layer comprising a second metal oxide having a higher oxygen content atomic percentage than the first metal oxide.

In this configuration, resistance change is allowed to take place only in a region of the variable resistance layer at an interface between the variable resistance layer and the second electrode, which region is higher in oxygen content atomic percentage. This is because a mechanism of a resistance changing operation is such that a redox reaction of oxygen in the vicinity of the interface of the electrode is predominant and the resistance changing operation occurs preferentially in a region of the interface where there is plenty of oxygen which contributes to the redox reaction. Thus, it becomes possible to implement a variable resistance non-volatile memory device which performs the resistance changing operation more stably.

In the above non-volatile memory device, each of the first metal oxide and the second metal oxide constituting the variable resistance layer may comprise at least one metal oxide selected from a group consisting of transition metal oxides and an aluminum oxide.

In the above non-volatile memory device, each of the first metal oxide and the second metal oxide constituting the variable resistance layer may comprise at least one metal oxide selected from a group consisting of a tantalum oxide, a hafnium oxide and a zirconium oxide.

Materials including tantalum, hafnium and zirconium are excellent in retention characteristic (retaining characteristic of resistance state) and enables a normal resistance changing operation to take place at a higher speed, when these materials are used as a variable resistance material. In a case where an element required to go through initial breakdown comprises any of these materials, break characteristics in initial breakdown operation can be made uniform. Therefore, by using any of these materials as a variable resistance material, the initial breakdown operation of the variable resistance element can be stabilized.

A method of manufacturing a non-volatile memory device according to Embodiment 1 comprises the steps of: forming a hard mask comprising an electrically-conductive material, on and above a stacked-layer structure including a first electrode material layer, a variable resistance material layer and a second electrode material layer such that the first electrode material layer, the variable resistance material layer and the second electrode material layer are stacked in this order; etching the stacked-layer structure using the hard mask, to form a first electrode, a variable resistance layer and a second electrode while leaving the hard mask; and forming a side wall protective layer such that the side wall protective layer covers a side wall of the first electrode, a side wall of the variable resistance layer, a side wall of the second electrode, and a side wall of the hard mask, in a state in which the hard mask is left on and above the second electrode, and the side wall protective layer extends across the second electrode to a position which is above an upper end of the second electrode and below an upper end of the connection layer, when viewed from a side.

In this method, in the non-volatile memory device, an area (area of heat release surface) of an exposed portion of the connection layer is greater than that in a structure in which the side wall protective layer extends to the upper end of the connection layer. Since the connection layer comprises the electrically-conductive material having a high heat conductivity, a heat release capability of the element can be enhanced. This can reduce a possibility of thermal degradation in the manufacturing process steps.

[Device Configuration]

FIG. 1 is a cross-sectional view showing an exemplary schematic configuration of the non-volatile memory device according to Embodiment 1. FIG. 1 shows constituents which are referred to as a memory cell array, a memory body section, etc., in a general semiconductor memory device. Hereinafter, a non-volatile memory device 100 of Embodiment 1 will be described with reference to FIG. 1.

In the example of FIG. 1, the non-volatile memory device 100 includes the first electrode 107, the variable resistance layer 108, the second electrode 109, the hard mask 111 (connection layer), the side wall protective layer 112, and the electrically-conductive layer 115.

<First Electrode>

The first electrode 107 may comprise, for example, a tantalum nitride having a thickness of 50 to 200 nm. In this case, the tantalum nitride is a first electrode material.

In a case where tantalum is used as transition metal contained in the variable resistance layer 108, a material which has a standard electrode potential equal to or less than that of tantalum and does not easily cause resistance change, may be used as the first electrode 107. Specifically, as the first electrode 107, at least one material selected from a group consisting of tantalum, a tantalum nitride, titanium, a titanium nitride, and a titanium-aluminum nitride, may be used. In this configuration, uniform memory characteristics can be implemented.

The first electrode 107 is not a transparent electrode.

<Variable Resistance Layer>

The variable resistance layer 108 is formed on and above the first electrode 107. The variable resistance layer 108 reversibly changes its resistance state between a high-resistance state and a low-resistance state in which its resistance value is smaller than that corresponding to the high-resistance state, in response to an electric signal applied between the first electrode 107 and the second electrode 109.

In the example of FIG. 1, the variable resistance layer 108 is sandwiched between the first electrode 107 and the second electrode 109, and is formed by a layer comprising an oxygen-deficient tantalum oxide having a thickness of 20 to 100 nm.

The variable resistance layer may include at least two layers including a first variable resistance layer comprising a first metal oxide, and a second variable resistance layer comprising a second metal oxide having a higher oxygen content atomic percentage than the first metal oxide. In the example of FIG. 1, the variable resistance layer 108 includes two layers which are a first variable resistance layer 108x comprising the first metal oxide and a second variable resistance layer 108y comprising the second metal oxide having a higher oxygen content atomic percentage than the first metal oxide.

In other words, the variable resistance layer 108 has a stacked-layer structure in which the first variable resistance layer 108x and the second variable resistance layer 108y are stacked together. The first variable resistance layer 108x comprises an oxygen-deficient tantalum oxide (TaO$_x$, 0<x<2.5). The second variable resistance layer 108y comprises a tantalum oxide (TaO$_y$, x<y) which is lower in degree of oxygen deficiency than the first variable resistance layer 108x.

Although in the above example, the first metal constituting the first metal oxide and the second metal constituting the second metal oxide are tantalum (Ta), the present invention is not limited to this.

Each of the first metal oxide and the second metal oxide constituting the variable resistance layer 108 may comprise at least one metal oxide selected from a group consisting of transition metal oxides and an aluminum oxide. Each of the first metal oxide and the second metal oxide constituting the variable resistance layer 108 may comprise at least one metal oxide selected from a group consisting of a tantalum oxide, a hafnium oxide and a zirconium oxide.

As the first metal and the second metal, for example, at least one transition metal selected from a group consisting of titanium (Ti), hafnium (Hf), zirconium (Zr), niobium (Nb), and tungsten (W), instead of tantalum (Ta). Since the transition metal can have plural oxidated states, different resistance states can be implemented by the redox reaction. As the first metal and the second metal, aluminum (Al) may be used.

In the case of using the hafnium oxide, x<y may be satisfied when the composition of the first metal oxide constituting the first variable resistance layer 108x is HfO$_x$ and the composition of the second metal oxide constituting the second variable resistance layer 108y is HfO$_y$. In addition, x and y may satisfy 0.9≤x≤1.6 and 1.8<y<2.0.

In this case, a high-degree-oxygen-deficiency layer (first variable resistance layer 108x) comprising the hafnium oxide can be deposited by, for example, reactive sputtering in which sputtering is conducted using a Hf target in an atmosphere of argon gas and oxygen gas. The oxygen content atomic percentage of the high-degree-oxygen-deficiency layer can be adjusted easily by changing a flow ratio of oxygen gas with respect to argon gas during execution of the reactive sputtering, as in the case of the above stated tantalum oxide. It should be noted that the substrate may not be heated but may be set to a room temperature.

A low-degree-oxygen-deficiency layer (second variable resistance layer 108y) comprising the hafnium oxide can be produced by, for example, exposing an obverse surface of the high-degree-oxygen-deficiency layer in a plasma of a mixture gas of argon gas and oxygen gas. A thickness of the low-degree-oxygen-deficiency layer can be easily adjusted by varying a time for which the obverse surface of the high-degree-oxygen-deficiency layer is exposed in the plasma of the mixture gas of argon gas and oxygen gas. A thickness of the second variable resistance layer 108y may be set to 3 to 4 nm.

In the case of using the zirconium oxide, x<y may be satisfied when the composition of the first metal oxide constituting the first variable resistance layer 108x is ZrO$_x$ and the composition of the second metal oxide constituting the second variable resistance layer 108y is ZrO$_y$. In addition, x and y may satisfy 0.9≤x≤1.4 and 1.9<y<2.0.

In this case, a high-degree-oxygen-deficiency layer (first variable resistance layer 108x) comprising the zirconium oxide can be deposited by, for example, reactive sputtering in which sputtering is conducted using a Zr target in an atmosphere of argon gas and oxygen gas. The oxygen content atomic percentage of the high-degree-oxygen-deficiency layer can be adjusted easily by changing a flow ratio of oxygen gas with respect to argon gas during execution of the reactive sputtering, as in the case of the above stated tantalum oxide. It should be noted that the substrate may not be heated but may be set to a room temperature.

A low-degree-oxygen-deficiency layer (second variable resistance layer 108y) comprising the zirconium oxide can be produced by, for example, exposing an obverse surface of the high-degree-oxygen-deficiency layer in a plasma of a mixture gas of argon gas and oxygen gas. A thickness of the low-degree-oxygen-deficiency layer can be easily adjusted by varying a time for which the obverse surface of the high-degree-oxygen-deficiency layer is exposed in the plasma of the mixture gas of argon gas and oxygen gas. A thickness of the second variable resistance layer 108y may be set to 1 to 5 nm.

Alternatively, the above stated hafnium oxide layer and the above stated zirconium oxide layer may be deposited by CVD or ALD (atomic layer deposition), instead of the sputtering.

As the second metal oxide, a material which is lower in degree of oxygen deficiency (having a greater resistance value) than the first metal oxide may be selected. In such a configuration, a larger portion of a voltage applied between the first electrode 107 and the second electrode 109 is fed to the second variable resistance layer 108y. In the vicinity of the interface between the second electrode 109 and the second variable resistance layer 108y, a plenty of oxygen which contributes to a reaction is present. Therefore, in a region of the interface between the second electrode 109 and the second variable resistance layer 108y, the redox reaction can selectively take place, and hence stable resistance change can be implemented. This facilitates the redox reaction taking place within the second variable resistance layer 108y.

The first metal constituting the first metal oxide and the second metal constituting the second metal oxide may be different metals.

A resistance changing phenomenon in the variable resistance layer comprising the oxygen-deficient metal oxide takes place by migration of oxygen. Therefore, kind of base metal may be different so long at least migration of oxygen is allowed to occur. Because of this, it is estimated that the same advantages are achieved even in a case where the first metal constituting the first variable resistance layer 108x and the second metal constituting the second variable resistance layer 108y are different metals.

In a case where the first metal and the second metal are different metals, the standard electrode potential of the second metal may be lower than that of the first metal. This is because it is estimated that the resistance changing phenomenon occurs by an event that the redox reaction takes place in a minute filament (conductive path) formed within the second metal oxide constituting the variable resistance layer 108y corresponding to a high resistance, and its resistance value changes.

For example, a stable resistance changing operation is attained by using the oxygen-deficient tantalum oxide as the first variable resistance layer 108x and by using titanium oxide ($TiO_2$) as the second variable resistance layer 108y. Titanium (standard electrode potential=−1.63 eV) has a lower standard electrode potential than tantalum (standard electrode potential=−0.6 eV). The standard electrode potential is a characteristic in which as its value is greater, the corresponding material is less easily oxidized. By placing as the second variable resistance layer 108y a metal oxide having a lower standard electrode potential than the first variable resistance layer 108x, the redox reaction easily takes place within the second variable resistance layer 108y. As another combination, for example, the oxygen-deficient tantalum oxide ($TaO_x$) may be used as the first variable resistance layer 108x, and the aluminum oxide ($Al_2O_3$) may be used as the second variable resistance layer 108y.

The variable resistance layer 108 may be configured such that its side wall portion is oxidated.

It is sufficient that each of the high-degree-oxygen-deficiency layer and the low-degree-oxygen-deficiency layer comprises as a main variable resistance layer in which resistance change occurs, for example, an oxide layer of tantalum, hafnium, zirconium, etc., or an oxide layer of aluminum. In addition to this, each of the high-degree-oxygen-deficiency layer and the low-degree-oxygen-deficiency layer may comprise, for example, a minute amount of other element. For example, to finely adjust the resistance value, each of the high-degree-oxygen-deficiency layer and the low-degree-oxygen-deficiency layer may be adapted to intentionally comprise a minute amount of other element. Such a case is included within the scope of the present invention. For example, if nitrogen is added to the variable resistance layer, the resistance value of the variable resistance layer is increased, which can improve a reactivity of resistance change.

In a case where the variable resistance layer is deposited by sputtering, ingress of a minimum amount of elements into the variable resistance layer sometimes occurs unintentionally, due to a residual gas or gas release from a wall of a vacuum container. As a matter of course, such a case where the variable resistance layer contains a minute amount of elements is included within the scope of the present invention.

The variable resistance layer 108 may not be constituted by two layers, but may be constituted by three or more layers, or a single layer.

<Second Electrode>

The second electrode 109 is formed on and above the variable resistance layer 108. The second electrode 109 may comprise, for example, iridium (Ir). In this case, iridium is a first electrode material.

The second electrode 109 may comprise a material which is higher in standard electrode potential than the metal constituting the second variable resistance layer 108y of the variable resistance layer 108, and the first electrode material constituting the first electrode 107, for example, at least one material, etc., which is selected from a group consisting of iridium, platinum (Pt), palladium (Pd), copper (Cu), and tungsten (W). In this configuration, the redox reaction can selectively take place, and a stable resistance changing phenomenon is implemented, in a region within the second variable resistance layer 108y, in the vicinity of the interface between the second electrode 109 and the second variable resistance layer 108y.

The second electrode 109 is not a transparent electrode.

<Hard Mask (Connection Layer)>

The hard mask 111 (connection layer) is a layer which is provided between the second electrode 109 and the electrically-conductive layer 115 to connect the second electrode 109 and the electrically-conductive layer 115 to each other, and comprises an electrically-conductive material different from a material constituting the electrically-conductive layer 115.

An etching rate of the material constituting the hard mask 111 (connection layer) may be lower than that of the material constituting the second electrode 109 (upper electrode).

The hard mask 111 is formed between the second electrode 109 and the electrically-conductive layer 115. The hard mask 111 may comprise, for example, a titanium-aluminum nitride having a thickness of 20 nm. The hard mask 111 may comprise, for example, a titanium nitride, a tantalum nitride, a metal, etc.

In the present embodiment, the electrically-conductive layer 115 is connected to the hard mask 111. For example, the electrically-conductive layer 115 may be formed so as to extend to a position which is below an upper end of the hard mask 111 such that a lower end of the electrically-conductive layer 115 is below the upper end of the hard mask 111, when viewed from a side. In this structure, the electrically-conductive layer 115 and the hard mask 111 are allowed to more surely contact each other.

Both of upper surface and side surface of a shoulder portion of an uppermost surface of the hard mask 111 are exposed to an etchant and etched at a high rate. This causes the shoulder portion of the hard mask 111 to be locally etched, and hence have a round corner portion.

As a result, the side wall protective layer 112 can be formed on a side wall portion of the stacked-layer structure of the variable resistance element 110 and the hard mask 111. Specifically, for example, the side wall protective layer 112 can be formed on a portion of the side wall portion which is below the round corner portion of the hard mask 111. Since the side wall protective layer 112 can be formed so as to extend across the second electrode 109 to a position which is above a plane defined by an uppermost surface of the second electrode 109 located at an uppermost portion of the variable resistance element 110 and below a plane defined by an uppermost surface of the hard mask 111 such that the upper end of the side wall protective layer 112 is located above the plane defined by the uppermost surface of the second electrode 109 and below the plane defined by the uppermost surface of the hard mask 111, an area (area of heat release surface) of an exposed portion of the connection layer is greater than that in a structure in which the side wall protective layer extends to the upper end of the connection layer. Since the connection layer comprises the electrically-conductive material having a high heat conductivity, a heat release capability of the element can be enhanced. This can reduce a possibility of thermal degradation in the manufacturing process steps.

<Side Wall Protective Layer>

The side wall protective layer 112 covers a side wall of the first electrode 107, a side wall of the variable resistance layer 108, and a side wall of the second electrode 109 and has an insulativity. The side wall protective layer 112 extends across the second electrode 109 to a position above the upper end of the second electrode 109 such that the upper end of the side wall protective layer 112 is located above the upper end of the second electrode 109, when viewed from a side.

As shown in FIG. 1, the side wall protective layer 112 is different from the interlayer insulating layer 113. As shown in FIG. 1, the side wall protective layer 112 has a shape in which a width in a direction (horizontal direction) in which the electrodes 107, 109, the variable resistance layer 108 and the hard mask 111 extend is smaller than a width in a direction (vertical direction, thickness direction) in which the electrodes 107, 109, the variable resistance layer 108 and the hard mask 111 are stacked together.

The side wall protective layer 112 may comprise, for example, a silicon nitride having a thickness of 10 to 50 nm.

The side wall protective layer 112 may extend across the second electrode 109 to a position above the plane defined by the uppermost surface of the second electrode 109 such that the upper end of the side wall protective layer 112 is located above the plane defined by the uppermost surface of the second electrode 109.

The upper end of the side wall protective layer 112 may be located above a plane which is parallel to an upper end surface of the interlayer insulating layer (not shown), the substrate (not shown), etc., with which a lower end of the variable resistance element 110 is in contact and passes through the upper end of the second electrode 109.

The side wall protective layer 112 may extend across the second electrode 109 to a position above the upper end of the second electrode 109 such that the upper end of the side wall protective layer 112 is located above the upper end of the second electrode 109.

The side wall protective layer 112 may comprise an oxide, a nitride, and an oxynitride (e.g., aluminum oxide and titanium oxide, etc.) having an insulativity and an oxygen barrier capability, instead of the silicon nitride.

The side wall protective layer 112 may comprise at least one material selected from a group consisting of an oxide, a nitride, and an oxynitride. The side wall protective layer 112 may comprise at least one material selected from a group consisting of a silicon nitride, an aluminum oxide and a titanium oxide.

The side wall protective layer 112 may be formed to be thinner in a direction from lower to upper. Specifically, for example, the side wall protective layer 112 may be formed such that a thickness a in a position of a height x from a horizontal plane passing through a lower end of the first electrode 107 and a thickness b in a position of a height y from the lower end of the first electrode satisfy a>b when x<y.

As shown in FIG. 1, the side wall protective layer 112 does not cover the upper end surface of the second electrode 109.

<Electrically-Conductive Layer>

The electrically-conductive layer 115 is connected to the second electrode 109. The electrically-conductive layer 115 comprises, for example, copper.

The electrically-conductive layer 115 covers the entire hard mask 111 and at least a portion of the side wall protective layer 112 which is located outward relative to the hard mask 111, when viewed from the thickness direction (direction in which the electrodes 107, 109, the variable resistance layer 108 and the hard mask 111 are stacked together.)

For example, the electrically-conductive layer 115 may be formed to extend to a position below a plane defined by an upper portion of the second electrode 109.

For example, the electrically-conductive layer 115 may be formed so as to extend to a position below the upper end of the second electrode 109 such that its lower end is below the upper end of the second electrode 109, when viewed from a side. The electrically-conductive layer 115 may be formed so as to extend to a position below the lower end of the second electrode 109 such that its lower end is below the lower end of the second electrode 109, when viewed from a side.

For example, the lower end of the electrically-conductive layer 115 may be located below a plane which is parallel to the upper end surface of the interlayer insulating layer (not shown), the substrate (not shown), etc., with which the lower end of the variable resistance element 110 is in contact and passes through the upper end of the second electrode 109. The lower end of the electrically-conductive layer 115 may be located below a plane which is parallel to the upper end surface of the interlayer insulating layer, the substrate, etc., and passes through the lower end of the second electrode 109.

In this configuration, the electrically-conductive layer 115 and the second electrode 109 are enabled to surely contact each other.

In the example of FIG. 1, the electrically-conductive layer 115 is formed inside of the interlayer insulating layer 113. The electrically-conductive layer 115 may comprise, for example, a barrier metal layer in contact with the second electrode 109 and a filling layer filled on and above the barrier metal layer. In this case, the barrier metal layer may have a structure in which a tantalum nitride having a thickness of 5 to 40 nm and tantalum having a thickness of 5 to 40 nm are stacked together. The filling layer may comprise copper. Alternatively, the filling layer may comprise a metal other than copper, for example, aluminum.

The electrically-conductive layer 115 may be a wire formed to extend in a particular direction or a plug formed to have a tubular shape.

As shown in FIG. 1, the electrically-conductive layer 115 covers an entire of the hard mask 111 and at least a portion of the side wall protective layer which is located outward relative to the hard mask 111, when viewed from the direction (vertical direction, thickness direction) in which the electrodes 107, 109, the variable resistance layer 108, and the hard mask 111 are stacked together.

As shown in FIG. 1, the electrically-conductive layer 115 covers the entire upper surface of the hard mask 111 and the upper surface of the side wall protective layer 112 such that the electrically-conductive layer 115 is physically in contact with them.

<Summary>

In the above configuration, since the side wall protective layer 112 extends across the second electrode 109 to a position above the upper end of the second electrode 109 such that the upper end of the side wall protective layer 112 is located above the upper end of the second electrode 109, when viewed from a side, it becomes possible to lessen non-uniformity of characteristics of memory elements (variable resistance elements) in the non-volatile memory device.

In the configuration of the present embodiment, the side wall portion of the variable resistance element 108 is less likely to contact the electrically-conductive layer 115, even when there is non-uniformity of heights of the side wall protective layers 112. This makes it possible to effectively reduce a possibility that a short circuit is formed between the electrically-conductive layer 115 and the variable resistance element 110 in a case where the electrically-conductive layer 115 and the variable resistance element 110 are directly connected to each other.

In addition, in accordance with this configuration, the non-volatile memory device according to the embodiment of the present embodiment is able to suppress non-uniformity of initial breakdown voltages even when the memory element is required to go through initial breakdown. Therefore, a reduction of a yield can be suppressed and reliability can be improved.

<Modified Example>

In the example of FIG. 1, the interlayer insulating layer 113 is formed so as cover the variable resistance element 110. In a case where the lower end of the variable resistance element 110 is in contact with the interlayer insulating layer (not shown), the substrate (not shown), etc., the interlayer insulating layer 113 may be formed so as to cover the interlayer insulating layer, the substrate, etc. The interlayer insulating layer 113 may comprise, for example, a silicon oxide having a thickness of 100 to 500 nm.

In the non-volatile memory device 100, for example, an interlayer insulating layer comprising a silicon oxide may be formed on and above a semiconductor substrate (not shown) provided with a transistor and the like.

In the non-volatile memory device 100, for example, the electrically-conductive layer may be formed inside of the interlayer insulating layer. The electrically-conductive layer may comprise, for example, a filling layer comprising copper, and a barrier metal layer having a structure in which a tantalum nitride having a thickness of 5 to 40 nm and tantalum having a thickness of 5 to 40 nm are stacked together. Alternatively, the filling layer may comprise a metal other than copper, for example, aluminum. The electrically-conductive layer may be, for example, a wire.

Specifically, the interlayer insulating layer comprising the silicon oxide is deposited on and above the semiconductor substrate by plasma CVD, etc. Then, a trench into which the electrically-conductive layer is filled is formed in the interlayer insulating layer, by photolithography and dry-etching. The barrier metal layer (having a structure in which the tantalum nitride layer having a thickness of 5 to 40 nm and tantalum having a thickness of 5 to 40 nm are stacked together), and a copper layer having a thickness of 50 to 300 nm, which will become a seed layer of a wire material, are deposited into the trench, by sputtering, etc. Then, by electroplating, etc., copper is further deposited on and above the copper seed layer so that the entire trench is filled with copper as a wire material. Then, an unnecessary upper portion of the deposited copper is removed by CMP (chemical mechanical polishing), so that an obverse surface of the interlayer insulating layer and an obverse surface of the electrically-conductive layer are planarized. In this way, the electrically-conductive layer is formed.

Further, in the non-volatile memory device 100, for example, a liner layer comprising a silicon nitride having a thickness of 30 to 200 nm, may be formed on and above the interlayer insulating layer including the electrically-conductive layer.

Specifically, the silicon nitride having a thickness of about 30 to 200 nm is deposited by plasma CVD, etc., to form the liner layer covering the interlayer insulating layer and the electrically-conductive layer.

Further, in the non-volatile memory device 100, for example, an interlayer insulating layer comprising a silicon oxide may be formed on and above the liner layer. If necessary, an obverse surface of the interlayer insulating layer may be treated by CMP, to lessen a level difference in the obverse surface.

Further, in the non-volatile memory device 100, for example, a plug having a diameter of 50 to 200 nm may be formed so as to penetrate the interlayer insulating layer and the liner later such that the plug is electrically connected to the electrically-conductive layer. The second electrode 109 may be formed such that it is connected to the plug exposed on an upper end surface of the interlayer insulating layer, covers the plug, and protrudes over a periphery of the plug.

Specifically, by photolithography and dry-etching, a contact hole is formed in a predetermined position of the electrically-conductive layer such that the contact hole penetrates the interlayer insulating layer and the liner layer and exposes the electrically-conductive layer. A hole diameter of the contact hole may be set to, for example, 50 to 300 nm. In a case where a width of the electrically-conductive layer is smaller than the diameter of the contact hole, an area of a portion of the electrically-conductive layer and a portion of the plug, which portions are in contact with each other, is varied among the variable resistance elements, due to mask misalignment, which may possibly cause non-uniformity of cell currents. To prevent this, the width of the electrically-conductive layer may be smaller than the diameter of the contact hole.

Then, the plug is filled into the contact hole. Specifically, initially, titanium nitride (TiN)/titanium (Ti) is deposited so as to have a thickness of 5 to 30 nm by sputtering, to form a lower layer serving as an adhesive layer and a diffusion layer. Then, on and above the lower layer, tungsten is deposited so as to have a thickness of 200 to 400 nm by CVD, to form an upper layer. As a result of this, the contact hole is filled with a filling material containing tungsten as a major component. Then, an entire wafer surface is polished and planarized by CMP to remove an unnecessary portion of the filling material over the interlayer insulating layer, thereby leaving the plug into the contact hole.

Further, in the non-volatile memory device 100, for example, the liner layer comprising a silicon nitride having a thickness of 30 to 200 nm may be formed so as to cover the interlayer insulating layer 113 and the electrically-conductive layer 115.

The variable resistance element 110 comprises the first electrode 107, the variable resistance layer 108 and the second electrode 109. The non-volatile memory device 100 may include a plurality of variable resistance elements 110. The non-volatile memory device 100 may include a plurality of variable resistance elements 110 arranged in matrix, and each of the variable resistance elements 110 may include the side wall protective layer 112.

More specifically, the non-volatile memory device 100 may include a memory cell array in which a plurality of memory cells (each including the variable resistance element 110) are arranged in array, and a drive circuit for driving the memory cell array.

The non-volatile memory device 100 may be configured such that a resistance state of a desired variable resistance element 110 is changed by applying an electric pulse used to write data which is supplied from the drive circuit to the memory cell array. The non-volatile memory device 100 may be configured such that a resistance state of a desired variable resistance element 110 is read by applying an electric pulse used to read data which is supplied from the drive circuit to the memory cell array.

Although the example in which the first electrode 107, the first variable resistance layer 108x, the second variable resistance layer 108y and the second electrode 109 are stacked in this order, has been described above, these layers may be stacked in a reversed order. That is, the second electrode 109, the second variable resistance layer 108y, the first variable resistance layer 108x, and the first electrode 107 may be stacked in this order on and above the substrate, etc.

[Manufacturing Method]

FIGS. 2A to 2H are cross-sectional views showing the steps of an exemplary manufacturing method of the non-volatile memory device according to Embodiment 1.

Figure 2A:
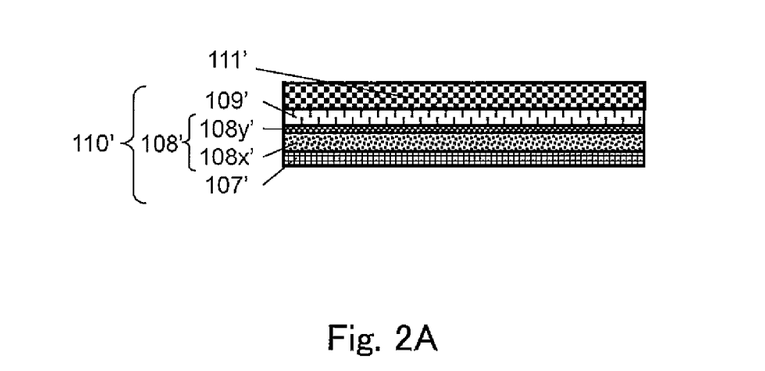
FIG. 2A is a cross-sectional view showing the step of an exemplary manufacturing method of the non-volatile memory device according to Embodiment 1, and is a cross-sectional view showing the step of forming a first electrode material layer, a variable resistance material layer, a second electrode material layer and a hard mask material layer in this order.

FIG. 2A is a cross-sectional view showing the step of forming a first electrode material layer, a variable resistance material layer, a second electrode material layer and a hard mask material layer in this order.

As exemplarily shown in FIG. 2A, initially, a first electrode material layer 107', a variable resistance material layer 108', a second electrode material layer 109' and a hard mask material layer 111' are formed in this order on and above, for example, the substrate (not shown), the interlayer insulating layer (not shown), etc.

Specifically, for example, the first electrode material layer 107' (thickness: 30 nm) comprising the tantalum nitride, the variable resistance material layer 108' (thickness: 50 nm) comprising an oxygen-deficient tantalum oxide, the second electrode material layer 109' (thickness: 50 nm) comprising iridium, and the electrically-conductive hard mask material layer 111' (thickness: 100 nm) comprising a titanium-aluminum nitride and used as a hard mask during dry-etching, are deposited in this order such that they are stacked together so as to form horizontally extending layers. The hard mask material layer 111' may be a material which does not have an electric conductivity.

The first electrode material layer 107', the second electrode material layer 109' and the hard mask material layer 111' may be deposited by sputtering, etc.

The variable resistance material layer 108' may be formed by, for example, reactive sputtering in which sputtering is conducted using a tantalum target in an atmosphere of argon and oxygen gas. By adjusting an oxygen flow rate, an oxygen concentration within the layer may be controlled to become 45 to 65 atm %. This allows the resistivity of a first variable resistance material layer 108x' to be adjusted to become 0.5 to 20 mΩ·cm (e.g., by controlling the oxygen concentration so that it becomes 60 atm %, the first variable resistance material layer 108x' having a resistivity of about 2 mΩ·cm can be deposited). In addition, the first variable resistance material layer 108x' may be oxidated so that a Ta$_2$O$_5$ layer having a thickness of 2 to 12 nm is formed on and above an uppermost surface of the first variable resistance material layer 108x' comprising an oxygen-deficient oxide, as a second variable resistance material layer 108y' having a higher oxygen content atomic percentage than the first variable resistance material layer 108x'.

In the step of FIG. 2A, the first electrode material layer 107', the variable resistance material layer 108', and the second electrode material layer 109' constitute a variable resistance element material layer 110'.

Figure 2B:
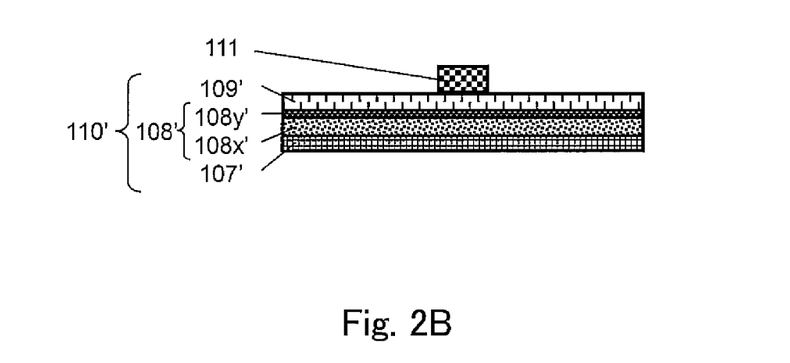
FIG. 2B is a cross-sectional view showing the step of the exemplary manufacturing method of the non-volatile memory device according to Embodiment 1, and is a cross-sectional view showing the step of forming a hard mask on and above the second electrode material layer.

FIG. 2B is a cross-sectional view showing the step of forming the hard mask on and above the second electrode material layer. The step of FIG. 2B is performed subsequently to and just after the step of FIG. 2A.

Specifically, for example, the hard mask material layer 111' is processed by photolithography and dry-etching, to form hard masks 111 (thickness: 100 nm, square shape having sides of 100 to 400 nm, for example, square shape having sides of 200 nm) patterned like independent islands. As a mask material, for example, a titanium-aluminum nitride may be used. As etching conditions, a mixture gas containing chlorine may be used.

In the examples of FIGS. 2A to 2H, the step of FIG. 2A and the step of FIG. 2B are the step of forming the hard mask on and above a stacked-layer structure in which the first electrode material layer, the variable resistance material layer and the second electrode material layer are stacked in this order.

Figure 2C:
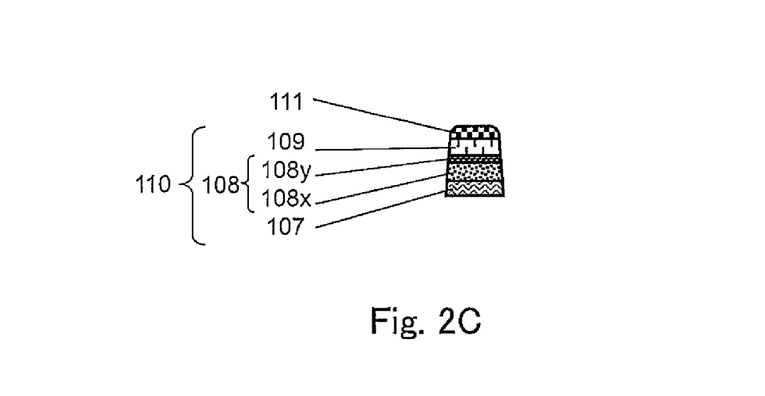
FIG. 2C is a cross-sectional view showing the step of the exemplary manufacturing method of the non-volatile memory device according to Embodiment 1, and is a cross-sectional view showing the step of forming a first electrode, a variable resistance layer and a second electrode by etching using the hard mask.

FIG. 2C is a cross-sectional view showing the step of forming the first electrode, the variable resistance layer and the second electrode by etching using the hard mask. The step of FIG. 2C is performed subsequently to and just after the step of FIG. 2B.

Specifically, for example, the stacked-layer structure including the first electrode material layer 107', the variable resistance material layer 108', and the second electrode material layer 109' which are stacked so as to form horizontally extending layers, are dry-etched by using as a mask the hard mask 111 formed by patterning. As the etching conditions, a mixture gas containing chlorine, or a mixture gas containing argon and oxygen may be used. Thus, stacked-layer structures including, for example, the variable resistance elements 110 (each including the first electrode 107, the variable resistance layer 108 and the second electrode 109) and the hard masks 111 located on and above upper portions of the variable resistance elements 110, are formed, the variable resistance elements 110 being formed like independent islands (square shape having sides of 100 to 400 nm, for example, square shape having sides of 200 nm) and each of the variable resistance elements 110 being connected to the corresponding plug lying therebelow.

In this case, in dry-etching of precious metal such as iridium and platinum, it is difficult to use a gas which is high in steam pressure. Because of this, in a case where the precious metal such as iridium and platinum is used as the electrode material of the variable resistance element 110, the second electrode 109 tends to have a trapezoidal cross-sectional shape having a taper angle which is less than 90 degrees.

Each of the first electrode 107 and the variable resistance layer 108 which are located below the second electrode 109 also tends to have a trapezoidal cross-sectional shape having a taper angle which is less than 90 degrees, because the shape of the second electrode 109 is transferred thereto.

After the dry-etching, both of upper surface and side surface of a shoulder portion of an uppermost surface of the hard mask 111 formed on and above the upper portion of the resistant variable element 110 are exposed to an etchant and therefore etched at a high rate. This causes the shoulder portion of the hard mask 111 to be locally etched and have a round corner portion.

In the example of FIGS. 2A to 2H, the step of FIG. 2C is the step of forming the first electrode, the variable resistance layer and the second electrode while leaving the hard mask by etching the first electrode material layer, the variable resistance material layer and the second electrode material layer using the hard mask.

Figure 2D:
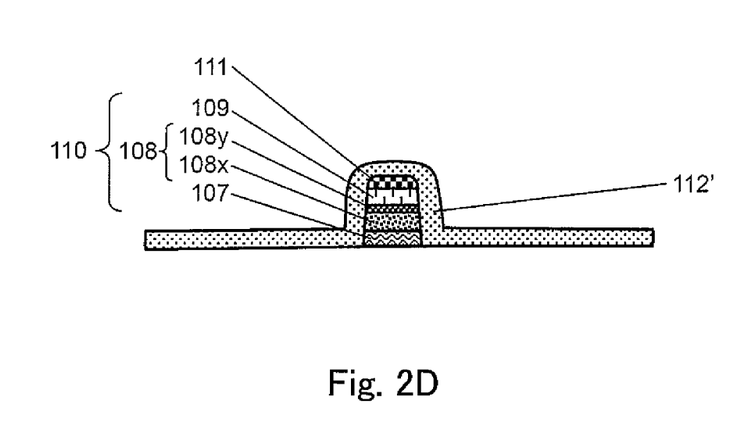
FIG. 2D is a cross-sectional view showing the step of the exemplary manufacturing method of the non-volatile memory device according to Embodiment 1, and is a cross-sectional view showing the step of forming a side wall protective material layer such that the side wall protective material layer covers a side wall of the first electrode, a side wall of the variable resistance layer, a side wall of the second electrode, and a side wall of the hard mask.

FIG. 2D is a cross-sectional view showing the step of forming a side wall protective material layer such that the side wall protective material layer covers the side wall of the first electrode, the side wall of the variable resistance layer, the side wall of the second electrode, and the side wall of the hard mask. The step of FIG. 2D is performed subsequently to and just after the step of FIG. 2C.

Specifically, for example, a side wall protective material layer 112' comprising a silicon nitride having a thickness of 70 nm is deposited over the variable resistance element 110 and the hard mask 111 (in some cases, interlayer insulating layer, substrate, etc., above which the variable resistance element 110 and the hard mask 111 are provided), by plasma CVD.

As a method of depositing the silicon nitride having a good step coverage with respect to a convex portion, typically, pressure-reduced CVD is used. The pressure-reduced CVD enables a thin layer having a good step coverage to be deposited because of a long average free path of reacting molecules.

In the pressure-reduced CVD, the layer is deposited under a high temperature of 650 to 800 degrees C. which is an internal temperature of a deposition chamber. Therefore, it is sometimes difficult to perform the pressure-reduced CVD after forming the wire. In this case, the side wall protective material layer 112' comprising a silicon nitride may be deposited by plasma CVD which allows the layer to be deposited at a lower temperature (250 to 400 degrees C.) than the pressure-reduced CVD.

The cross-sectional shape of the stacked-layer structure of the variable resistance element 110 and the hard mask 111 has a trapezoidal shape in which the taper angle of the side wall is less than 90 degrees. Therefore, the side wall protective material layer 112' comprising a silicon nitride can be deposited so as to conformally cover the side wall of the stacked-layer structure of the variable resistance element 110 and the hard mask 111, even when the plasma CVD which is inferior in step coverage to the pressure-reduced CVD, is used.

The term "conformal" means a shape adaptivity, and that the side wall protective material layer 112' having a substantially uniform thickness can be deposited on the upper surface and side surface of the stacked-layer structure of the variable resistance element 110 and the hard mask 111 without a lack, and especially without a discontinuity in a level difference portion.

The side wall protective material layer 112' comprising the silicon nitride may be deposited using sputtering. The silicon nitride may be deposited by, for example, reactive sputtering in which sputtering is conducted using a polycrystalline silicon as a target in an atmosphere of a mixture gas of argon and nitrogen.

Figure 2E:
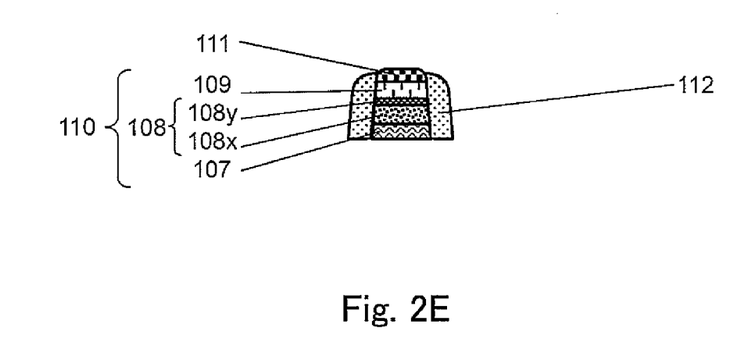
FIG. 2E is a cross-sectional view showing the step of the exemplary manufacturing method of the non-volatile memory device according to Embodiment 1, and is a cross-sectional view showing the step of forming a side wall protective layer by removing a portion of the side wall protective material layer.

FIG. 2E is a cross-sectional view showing the step of forming the side wall protective layer by removing a portion of the side wall protective material layer. The step of FIG. 2E is performed subsequently to and just after the step of FIG. 2D.

Specifically, for example, the side wall protective material layer 112' is etched-back to remove a portion (over the hard mask 111, the interlayer insulating layer (not shown), the substrate (not shown), etc.) of the side wall protective material layer 112' which is other than a portion covering the side wall of the stacked-layer structure of the variable resistance element 110 and the hard mask 111, thereby forming the side wall protective layer 112.

In a case where reactive ion etching (RIE) is used as a method of etching-back the side wall protective material layer 112' comprising the silicon nitride, typically, an etching rate in an ion injecting direction (longitudinal direction) is much higher than an etching rate in a direction (lateral direction) which is not the ion injecting direction. This allows the side wall protective layer 112 to be left only on the side wall portion of the stacked-layer structure of the variable resistance element 110 and the hard mask 111. Specifically, for example, the side wall protective layer 112 can be left only on the side wall portion which is below the round corner portion of the hard mask 111.

In the example of FIGS. 2A to 2H, the step of FIG. 2D and the step of FIG. 2E are the step of forming the side wall protective layer such that the side wall protective layer covers the side wall of the first electrode, the side wall of the variable resistance layer, the side wall of the second electrode, and the side wall of the hard mask, in a state in which the hard mask is left on and above the second electrode.

Figure 2F:
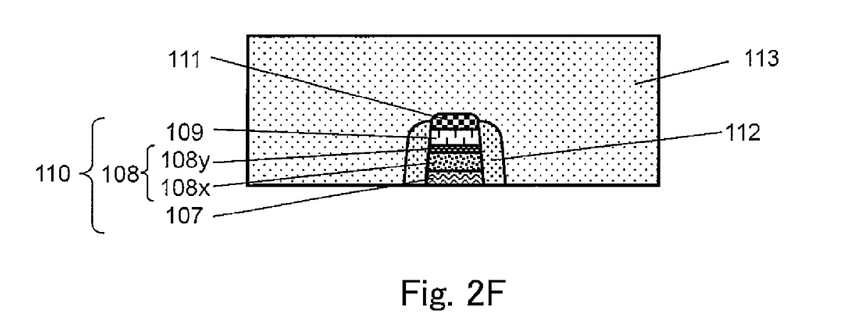
FIG. 2F is a cross-sectional view showing the step of the exemplary manufacturing method of the non-volatile memory device according to Embodiment 1, and is a cross-sectional view showing the step of depositing an interlayer insulating layer such that the interlayer insulating layer covers the first electrode, the variable resistance layer, the second electrode, the hard mask, and the side wall protective layer.

FIG. 2F is a cross-sectional view showing the step of depositing an interlayer insulating layer such that the interlayer insulating layer covers the first electrode, the variable resistance layer, the second electrode, the hard mask, and the side wall protective layer. The step of FIG. 2F is performed subsequently to and just after the step of FIG. 2E.

Specifically, for example, the interlayer insulating layer 113 comprising the silicon oxide, etc., is deposited over the interlayer insulating layer (not shown) including the variable resistance element 110, the hard mask 111, and the side wall protective layer 112, by plasma CVD, etc. The interlayer insulating layer 113 allows the electrically-conductive layer 115 to be buried therein.

Figure 2G:
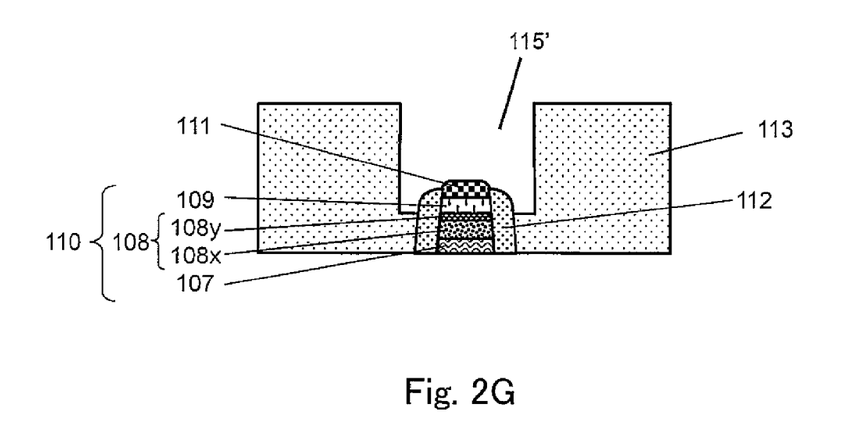
FIG. 2G is a cross-sectional view showing the step of the exemplary manufacturing method of the non-volatile memory device according to Embodiment 1, and is a cross-sectional view showing the step of forming an opening in the interlayer insulating layer such that the hard mask is exposed.

FIG. 2G is a cross-sectional view showing the step of forming an opening in the interlayer insulating layer such that the hard mask is exposed. The step of FIG. 2G is performed subsequently to and just after the step of FIG. 2F.

Specifically, for example, by photolithography and dry-etching, the opening 115' is formed in the interlayer insulating layer 113. The opening 115' may have, for example, a hole shape to allow a contact plug to be filled thereinto, or a trench shape extending in one direction to allow a wire to be filled therein.

The opening 115' is formed such that the hard mask 111 is exposed. The opening 115' is used to fill the electrically-conductive layer 115 thereinto. The opening 115' may extend to a position which is below the plane defined by the upper portion of the hard mask 111. This allows the electrically-conductive layer 115 and the hard mask 111 to be surely in contact with each other.

With the opening 115' formed to extend to a position which is below the plane defined by the upper portion of the hard mask 111, the entire hard mask 111 and at least a portion of the side wall protective layer which is located outward relative to the hard mask 111 are exposed within the opening 115', when viewed from the direction (vertical direction, thickness direction) in which the electrodes 107, 109, the variable resistance layer 108, and the hard mask 111 are stacked together, as shown in FIG. 2G.

In other words, with the opening 115' formed to extend to a position which is below the plane defined by the upper portion of the hard mask 111, the entire upper surface of the hard mask 111 and the upper surface of the side wall protective layer 112 are exposed within the opening 115', as shown in FIG. 2G.

The side wall portion of the variable resistance element 110 is covered with the side wall protective layer 112 comprising the silicon nitride. With this structure, even when the opening 115' is formed to have a great depth, the side wall protective layer 112 is formed on the side surface of the variable resistance layer 108 so as to extend across the second electrode 109 to a position which is above the upper end of the second electrode 109 and below the upper end of the hard mask 111 such that the upper end of the side wall protective layer 112 is located above the upper end of the second electrode 109 and below the upper end of the hard mask 111, when viewed from a side. Therefore, an area (area of heat release surface) of an exposed portion of the hard mask 111 is greater than that in a structure in which the side wall protective layer extends to the upper end of the hard mask 111 (connection layer). Since the hard mask 111 comprises the electrically-conductive material having a high heat conductivity, a heat release capability of the element can be enhanced. This can reduce a possibility of thermal degradation in the manufacturing process steps.

Hereinafter, the step of forming the opening 115' will be described in detail.

Initially, the interlayer insulating layer 113 comprising the silicon oxide is etched, to expose the uppermost surface of the second electrode 109 and the side wall protective layer 112 comprising the silicon nitride, within the opening 115'.

Etching conditions are, for example, such that a chamber pressure is 2.1 Pa, and $C_5F_8$ flow rate of 17 sccm, $O_2$ flow rate of 23 sccm, and Ar flow rate of 500 sccm are used as etching gases. In this case, the etching rate of the silicon nitride is about 1/20 of the etching rate of the silicon oxide.

Therefore, as shown in FIG. 2G, in a state in which the opening 115' reaches a position below the hard mask 111, at least a portion of the side surface of the hard mask 111 as well as the upper surface of the hard mask 111 are exposed. Because of this, the area (area of heat release surface) of the exposed portion of the hard mask 111 increases. Since the hard mask 111 comprises the electrically-conductive material having a high heat conductivity, the heat release capability of the element can be enhanced. This can reduce a possibility of thermal degradation (e.g., degradation of variable resistance layer, etc.) in the manufacturing process steps.

Figure 2H:
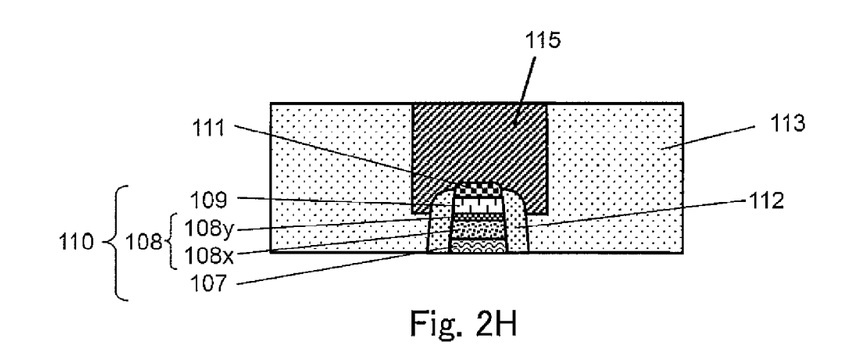
FIG. 2H is a cross-sectional view showing the step of the exemplary manufacturing method of the non-volatile memory device according to Embodiment 1, and is a cross-sectional view showing the step of forming an electrically-conductive layer such that the opening is filled with the electrically-conductive layer.

FIG. 2H is a cross-sectional view showing the step of forming the electrically-conductive layer such that the opening is filled with the electrically-conductive layer. The step of FIG. 2H is performed subsequently to and just after the step of FIG. 2G.

With the opening 115' formed to extend to a position which is below the plane defined by the upper portion of the hard mask 111 and the electrically-conductive layer 115 filled into the opening 115', the entire hard mask 111 and at least a portion of the side wall protective layer located outward relative to the hard mask 111 are covered with the electrically-conductive layer 115, when viewed from the direction (vertical direction, thickness direction) in which the electrodes 107, 109, the variable resistance layer 108, and the hard mask 111 are stacked together, as shown in FIG. 2H.

In other words, with the opening 115' formed to extend to a position which is below the plane defined by the upper portion of the hard mask 111 and the electrically-conductive layer 115 filled into the opening 115', the entire upper surface of the hard mask 111 and the upper surface of the protruding portion of the side wall protective layer 112 are covered with and are physically in contact with the electrically-conductive layer 115, as shown in FIG. 2H.

Specifically, for example, the barrier metal layer (e.g., having a structure in which a tantalum nitride layer having a thickness of 5 to 40 nm and tantalum having a thickness of 5 to 40 nm are stacked together), and a copper layer having a thickness of 50 to 300 nm, which will become a seed layer of a wire material, are deposited into the opening 115', by sputtering, etc. Then, by electroplating, etc., copper is further deposited on and above the copper seed layer, and filled into the opening. Then, an unnecessary upper portion of the deposited copper and the barrier metal layer are removed by CMP, to planarize an obverse surface of the interlayer insulating layer 113 and an obverse surface of the electrically-conductive layer 115. In this way, the electrically-conductive layer is formed.

Moreover, for example, a liner layer comprising a silicon nitride having a thickness of 30 to 200 nm, may be formed on and above the interlayer insulating layer 113 including the electrically-conductive layer 115. Specifically, for example, a silicon nitride is deposited to have a thickness of 30 to 200 nm, by plasma CVD, etc., thereby forming the liner layer covering the interlayer insulating layer 113 and the electrically-conductive layer 115.

(Embodiment 2)

A non-volatile memory device of Embodiment 2 is the manufacturing method of the non-volatile memory device according to any one of Embodiment 1 and modified examples of Embodiment 1 and further comprises a diode element connected to at least one of the first electrode and the second electrode.

In such a configuration, it becomes possible to surely avoid occurrence of write disturb in an adjacent variable resistance element. Thus, it becomes possible to implement a variable resistance non-volatile memory device which has a high capacity and is capable of high integration, without placing a switching element such as a transistor.

Figure 3:
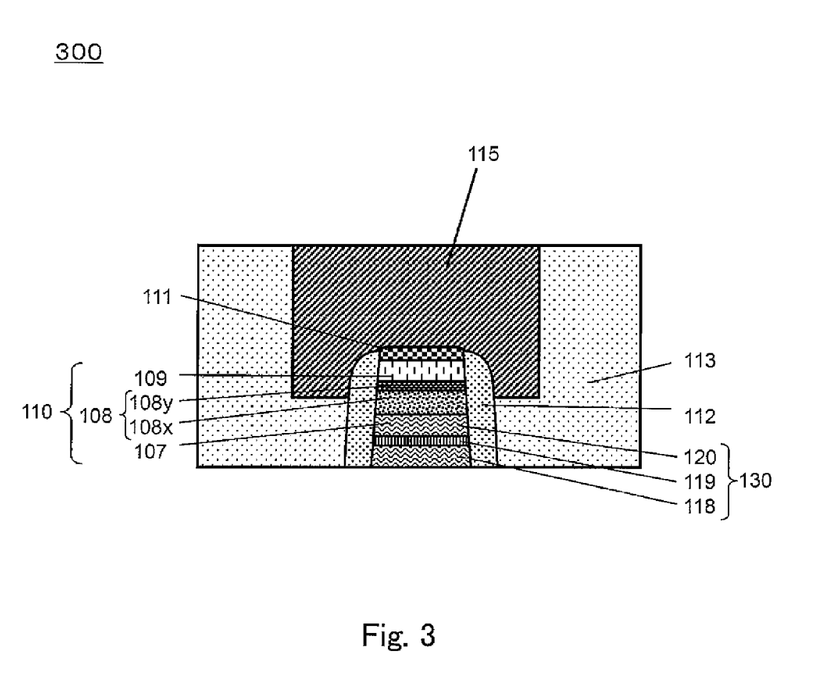
FIG. 3 is a cross-sectional view showing an exemplary schematic configuration of a non-volatile memory device according to Embodiment 2.

FIG. 3 is a cross-sectional view showing an exemplary schematic configuration of the non-volatile memory device according to Embodiment 2. FIG. 3 shows a portion called a memory cell array or a memory main body in a general semiconductor memory device. Hereinafter, a non-volatile memory device 300 of Embodiment 2 will be described with reference to FIG. 3.

In the example of FIG. 3, the non-volatile memory device 300 includes a diode element 130.

The diode element 130 is connected to at least one of the first electrode and the second electrode. In the example of FIG. 3, the diode element 130 is connected to the first electrode 107.

The phrase "connected to at least one of the first electrode and the second electrode" is meant to include a case where at least one of the first electrode and the second electrode is an electrode of the diode element. In the example of FIG. 3, the first electrode 107 is an upper electrode of the diode element. The electrode of the diode element may be formed independently of the electrode of the variable resistance element.

In the example shown in FIG. 3, the diode element 130 includes a third electrode 118, a semiconductor layer 119 formed on and above the third electrode 118 so as to contact the third electrode 118, and a fourth electrode 120 formed on and above the semiconductor layer 119 so as to contact the semiconductor layer 119. The first electrode 107 and the fourth electrode 120 are an identical constituent. The diode element 130 may be, for example, at least one of a MSM diode and a MIM diode.

The third electrode 118 may comprise, for example, a tantalum nitride having a thickness of 25 nm.

The semiconductor layer 119 may comprise, for example, a silicon nitride having a thickness of 11 nm.

The fourth electrode 120 may comprise, for example, a tantalum nitride having a thickness of 20 nm.

The diode element 130 has a shape in which an upper end surface of the third electrode 118 is planarized, and an upper end surface of the semiconductor layer 119 formed above the third electrode 118 is planarized.

Although the diode element 130 is formed below the variable resistance element 110 such that the diode element 130 is in contact with the first electrode 107 of the variable resistance element 110 as described above, the diode element 130 may be formed above the variable resistance element 110 such that the diode element 130 is in contact with the second electrode 109 of the variable resistance element 110.

In the variable resistance element 110 of the present embodiment, as in the variable resistance element 110 of Embodiment 1, the side wall protective layer 112 is formed so as to extend to a position which is above the plane defined by the uppermost surface of the second electrode 109. Therefore, even when there is non-uniformity of heights of the side wall protective layers 112, the side wall portion of the variable resistance layer 108 and the side wall portion of the diode element 130 are less likely to contact the electrically-conductive layer 115.

Thus, it becomes possible to lessen non-uniformity of characteristics of memory elements (variable resistance elements) in the non-volatile memory device. That is, it becomes possible to effectively reduce a possibility that a short circuit is formed between the electrically-conductive layer 115 and the variable resistance element 110 in a case where the electrically-conductive layer 115 and the variable resistance element 110 are directly connected to each other.

In addition, in accordance with this configuration, the non-volatile memory device according to an aspect of the present invention is capable of lessening non-uniformity of initial breakdown voltages even when the memory element is required to go through initial breakdown. Therefore, it becomes possible to effectively lessen non-uniformity of amounts of currents flowing during the initial breakdown operation. Since non-uniformity of breakdown of the diode elements 130 can be prevented, reduction of a yield can be suppressed and reliability can be improved.

The present embodiment may be modified as in Embodiment 1.

Numeral improvements and alternative embodiments of the present invention will be conceived by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

An aspect of the present invention is useful as a non-volatile memory device which is capable of reducing a possibility of thermal degradation in manufacturing process steps.

REFERENCE SIGNS LIST 100 non-volatile memory device
107 first electrode
107' first electrode material layer
108 variable resistance layer
108' variable resistance material layer
108x first variable resistance layer
108x' first variable resistance material layer
108y second variable resistance layer
108y' second variable resistance material layer
109 second electrode
109' second electrode material layer
110 variable resistance element
110' variable resistance element material layer
111 hard mask
111' hard mask material layer
112 side wall protective layer
112' side wall protective material layer
113 interlayer insulating layer
115 electrically-conductive layer
115' opening
118 third electrode
119 semiconductor layer
120 fourth electrode
130 diode element
300 non-volatile memory device

What is claimed is:

1. A non-volatile memory device comprising:
a first electrode;
a variable resistance layer formed on and above the first electrode;
a second electrode formed on and above the variable resistance layer;
a side wall protective insulating layer covering a side wall of the first electrode, a side wall of the variable resistance layer and a side wall of the second electrode;
an interlayer insulating layer covering at least a part of the side wall protective insulating layer;
an electrically-conductive layer; and
a connection layer which is provided between the second electrode and the electrically-conductive layer to connect the second electrode and the electrically-conductive layer to each other, and comprises an electrically-conductive material different from a material constituting the electrically-conductive layer, wherein:
the side wall protective insulating layer extends across the second electrode to a position which is above an uppermost end of the second electrode and below an uppermost end of the connection layer and an uppermost end of the side wall protective insulating layer is located above the uppermost end of the second electrode and below the uppermost end of the connection layer, when viewed from a side,
the electrically-conductive layer covers an entirety of the connection layer, when viewed from a thickness direction, and
the electrically-conductive layer directly contacts with at least a portion of the side wall protective insulating layer.

2. The non-volatile memory device according to claim 1, wherein the side wall protective insulating layer comprises at least one material selected from the group consisting of an oxide, a nitride, and an oxynitride.

3. The non-volatile memory device according to claim 1, wherein the side wall protective insulating layer comprises at least one material selected from the group consisting of a silicon nitride, an aluminum oxide, and a titanium oxide.

4. The non-volatile memory device according to claim 1, wherein the side wall protective insulating layer is configured such that a thickness a in a position of a height x from a horizontal plane passing through a lower end of the first electrode and a thickness b in a position of a height y from the lower end of the first electrode satisfy a >b when x <y.

5. The non-volatile memory device according to claim 1, wherein the variable resistance layer includes at least two layers including:
a first variable resistance layer comprising a first metal oxide; and
a second variable resistance layer comprising a second metal oxide having a higher oxygen content in atomic percentage than the first metal oxide.

6. The non-volatile memory device according to claim 5, wherein each of the first metal oxide and the second metal oxide constituting the variable resistance layer comprises at least one metal oxide selected from the group consisting of transition metal oxides and an aluminum oxide.

7. The non-volatile memory device according to claim 5, wherein each of the first metal oxide and the second metal oxide constituting the variable resistance layer comprises at least one metal oxide selected from the group consisting of a tantalum oxide, a hafnium oxide and a zirconium oxide.

8. The non-volatile memory device according to claim 1, further comprising:
   a diode element connected to at least one of he first electrode and the second electrode.

9. The non-volatile memory device according to claim 1, wherein the uppermost end of the second electrode is located above a lowermost end of the electrically-conductive layer.

10. The non-volatile memory device according to claim 1, wherein the side wall protective insulating layer does not cover an upper surface of the second electrode.

11. The non-volatile memory device according to claim 1, wherein the uppermost end of the connection layer is located above a lowermost end of the electrically-conductive layer and below an uppermost end of the electrically-conductive layer.

12. The non-volatile memory device according to claim 1, wherein the connection layer covers an entirety of an upper surface of the second electrode, when viewed from the thickness direction.

13. The non-volatile memory device according to claim 12, wherein the electrically-conductive layer further covers at least a portion of the side wall protective insulating layer located outward relative to the second electrode, when viewed from the thickness direction.

14. The non-volatile memory device according to claim 1, wherein a portion of the side wall protective insulating layer is located between the interlayer insulating layer and the variable resistance layer.

* * * * *